(12) United States Patent
Coskun et al.

(10) Patent No.: US 12,248,254 B2
(45) Date of Patent: Mar. 11, 2025

(54) UNIVERSAL METROLOGY FILE, PROTOCOL, AND PROCESS FOR MASKLESS LITHOGRAPHY SYSTEMS

(71) Applicant: Applied Materials, Inc., Santa Clara, CA (US)

(72) Inventors: Tamer Coskun, San Jose, CA (US); Jang Fung Chen, Cupertino, CA (US); Douglas Joseph Van Den Broeke, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 480 days.

(21) Appl. No.: 17/754,072

(22) PCT Filed: Oct. 8, 2019

(86) PCT No.: PCT/US2019/055135
§ 371 (c)(1),
(2) Date: Mar. 23, 2022

(87) PCT Pub. No.: WO2021/071472
PCT Pub. Date: Apr. 15, 2021

(65) Prior Publication Data
US 2022/0382171 A1 Dec. 1, 2022

(51) Int. Cl.
*G06F 30/30* (2020.01)
*G03F 7/00* (2006.01)

(52) U.S. Cl.
CPC ...... *G03F 7/70508* (2013.01); *G03F 7/70291* (2013.01); *G03F 7/70616* (2013.01)

(58) Field of Classification Search
CPC ............ G03F 7/70508; G03F 7/70291; G03F 7/70616; G03F 7/70525
See application file for complete search history.

(56) References Cited

U.S. PATENT DOCUMENTS

| | | |
|---|---|---|
| 6,490,145 B1 | 12/2002 | Kholodenko et al. |
| 7,033,444 B1 | 4/2006 | Komino et al. |

(Continued)

FOREIGN PATENT DOCUMENTS

| | | | |
|---|---|---|---|
| JP | 2001110883 A | 4/2001 | |
| JP | 2001347480 A | 12/2001 | |

(Continued)

OTHER PUBLICATIONS

International Search Report and the Written Opinion of the International Searching Authority for PCT/US2020/040220 mailed on Oct. 15, 2020, 12 pages.

(Continued)

*Primary Examiner* — Jack Chiang
*Assistant Examiner* — Brandon Bowers
(74) *Attorney, Agent, or Firm* — Patterson + Sheridan, LLP; B. Todd Patterson (57) ABSTRACT

Embodiments of the present disclosure relate to a system, a software application, and a method of a lithography process to update one or more of a mask pattern, maskless lithography device parameters, lithography process parameters utilizing a file readable by each of the components of a lithography environment. The file readable by each of the components of a lithography environment stores and shares textual data and facilitates communication between of the components of a lithography environment such that the mask pattern corresponds to a pattern to be written is updated, the maskless lithography device of the lithography environment is calibrated, and process parameters of the lithography process are corrected for accurate writing of the mask pattern on successive substrates.

15 Claims, 5 Drawing Sheets

(56) References Cited

U.S. PATENT DOCUMENTS

| | | | |
|---|---|---|---|
| 2003/0160568 A1 | 8/2003 | Arai et al. | |
| 2003/0226951 A1* | 12/2003 | Ye | G03F 7/7065 |
| | | | 250/208.1 |
| 2004/0226515 A1 | 11/2004 | Yendler et al. | |
| 2008/0089001 A1 | 4/2008 | Parkhe et al. | |
| 2010/0039747 A1 | 2/2010 | Sansoni et al. | |
| 2011/0170081 A1 | 7/2011 | Sung | |
| 2012/0117520 A1 | 5/2012 | Kitamura et al. | |
| 2013/0068750 A1 | 3/2013 | Gaff et al. | |
| 2014/0199791 A1 | 7/2014 | Park et al. | |
| 2016/0124323 A1 | 5/2016 | Chung et al. | |
| 2017/0140969 A1 | 5/2017 | Kuo et al. | |
| 2019/0243250 A1 | 8/2019 | Laidig et al. | |
| 2019/0348316 A1 | 11/2019 | Hayashi | |
| 2020/0326640 A1* | 10/2020 | Tzemah | H01L 22/20 |

FOREIGN PATENT DOCUMENTS

| | | |
|---|---|---|
| JP | 2018006768 A | 1/2018 |
| TW | 201937301 A | 9/2019 |

OTHER PUBLICATIONS

International Search Report/ Written Opinion issued to PCT/US2019/055135 on Jul. 7, 2020.
Taiwan Office Action dated Sep. 28, 2023 for Application No. 109122517.
Taiwan Office Action issued to patent appication No. 109133822 on May 3, 2024.
Taiwan Office Action dated Aug. 2, 2024 for Application No. 109122517.

* cited by examiner

UNIVERSAL METROLOGY FILE, PROTOCOL, AND PROCESS FOR MASKLESS LITHOGRAPHY SYSTEMS

BACKGROUND

Field

Embodiments of the present disclosure generally relate to lithography systems. More particularly, embodiments of the present disclosure relate to a system, a software application, and a method of a lithography process to update one or more of a mask pattern, maskless lithography device parameters, and lithography process parameters utilizing a file readable by each of the components of the lithography environment.

Description of the Related Art

Maskless lithography is used in the manufacturing of semiconductor devices, such as for back-end processing of semiconductor devices, and display devices, such as liquid crystal displays (LCDs). With a conventional lithography environment, to write a pattern of features of a mask pattern into a photoresist disposed over a substrate, compile measurements of the pattern of features, update the mask pattern per the compile measurements, and write the pattern of features of the updates mask pattern on photoresists of separate substrates, separate file formats and protocols between each of the components of the lithography environment are required. Furthermore, to update parameters of the maskless lithography device and the lithography process separate file formats and protocols between each of the components of the lithography environment are required. The use of separate file formats and protocols between each component of the lithography environment introduces errors in conversions between the formats and protocols, and in turn may result inaccuracies of the developed pattern, processing delays, and decrease throughput.

Accordingly, what is needed in the art is a lithography environment, a software application, and a method of a lithography process to update one or more of a mask pattern, maskless lithography device parameters, and lithography process parameters utilizing a file readable by each of the components of the lithography environment.

SUMMARY

In one embodiment, a method is provided. The method includes creating a design file and a universal metrology file (UMF) file with a virtual mask device of a lithography environment. The lithography environment includes a controller operable to be connected to the virtual mask device, a metrology device, and a maskless lithography device. The UMF file is readable by each of the controller, the virtual mask device, the metrology device, and the maskless lithography device. The design file is transmitted to the maskless lithography device and the UMF file is transmitted to the metrology device. A lithography process is performed that includes patterning a first substrate based on the design file with the maskless lithography device and transferring the first substrate patterned by the maskless lithography device to the metrology device. One or more metrology processes are performed with the metrology device according to instructions of the UMF file and the UMF file is populated with metrology measurements. A first portion of one or more applications is performed with the metrology device according to instructions of the UMF file and at least one of a correction model and a calibration offset data is compiled in the UMF file. The UMF file is transmitted to at least one of the virtual mask device and the maskless lithography device. The design file is updated with at least one of the virtual mask device and the maskless lithography device.

In another embodiment, a non-transitory computer-readable medium is provided. The non-transitory computer-readable medium storing instructions that, when executed by a processor, cause a computer system to perform the steps of creating a design file and a universal metrology file (UMF) file with a virtual mask device of a lithography environment. The lithography environment includes a controller operable to be connected to the virtual mask device, a metrology device, and a maskless lithography device. The UMF file is readable by each of the controller, the virtual mask device, the metrology device, and the maskless lithography device. The design file is transmitted to the maskless lithography device and the UMF file is transmitted to the metrology device. A lithography process is performed that includes patterning a first substrate with the maskless lithography device and transferring the first substrate patterned by the maskless lithography device to the metrology device. One or more metrology processes are performed with the metrology device according to instructions of the UMF file and the UMF file is populated with metrology measurements. A first portion of one or more applications is performed with the metrology device according to instructions of the UMF file and at least one of a correction model and a calibration offset data is compiled in the UMF file. The UMF file is transmitted to at least one of the virtual mask device and the maskless lithography device. At least one of the design file, lithography process parameters, and maskless lithography device parameters are updated according to at least one of the correction model and the calibration offset data with at least one of the virtual mask device and the maskless lithography device.

In another embodiment, a non-transitory computer-readable medium is provided. The non-transitory computer-readable medium includes a format having a text-based markup language that is readable and operable to be transmitted between a virtual mask device, a metrology device, a maskless lithography device, and a controller of a lithography environment. A plurality of sections of the non-transitory computer-readable medium have elements operable to be retained and stored in the non-transitory computer-readable medium by each of the virtual mask device, the metrology device, the maskless lithography device, and the controller. The plurality of sections include an identification section, a metrology instruction section, an application instruction section, an alignment mark section, an image saving section, and a metrology measurement section.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to lithography systems. More particularly, embodiments of the present disclosure relate to a system, a software application, and a method of a lithography process to update one or more of a mask pattern, maskless lithography device parameters, lithography process parameters utilizing a file readable by each of the components of a lithography environment. The file readable by each of the components of a lithography environment stores and shares textual data and facilitates communication between of the components of a lithography environment such that the mask pattern corresponds to a pattern to be written is updated, the maskless lithography device of the lithography environment is calibrated, and process parameters of the lithography process are corrected for accurate writing of the mask pattern on successive substrates.

Figure 1:
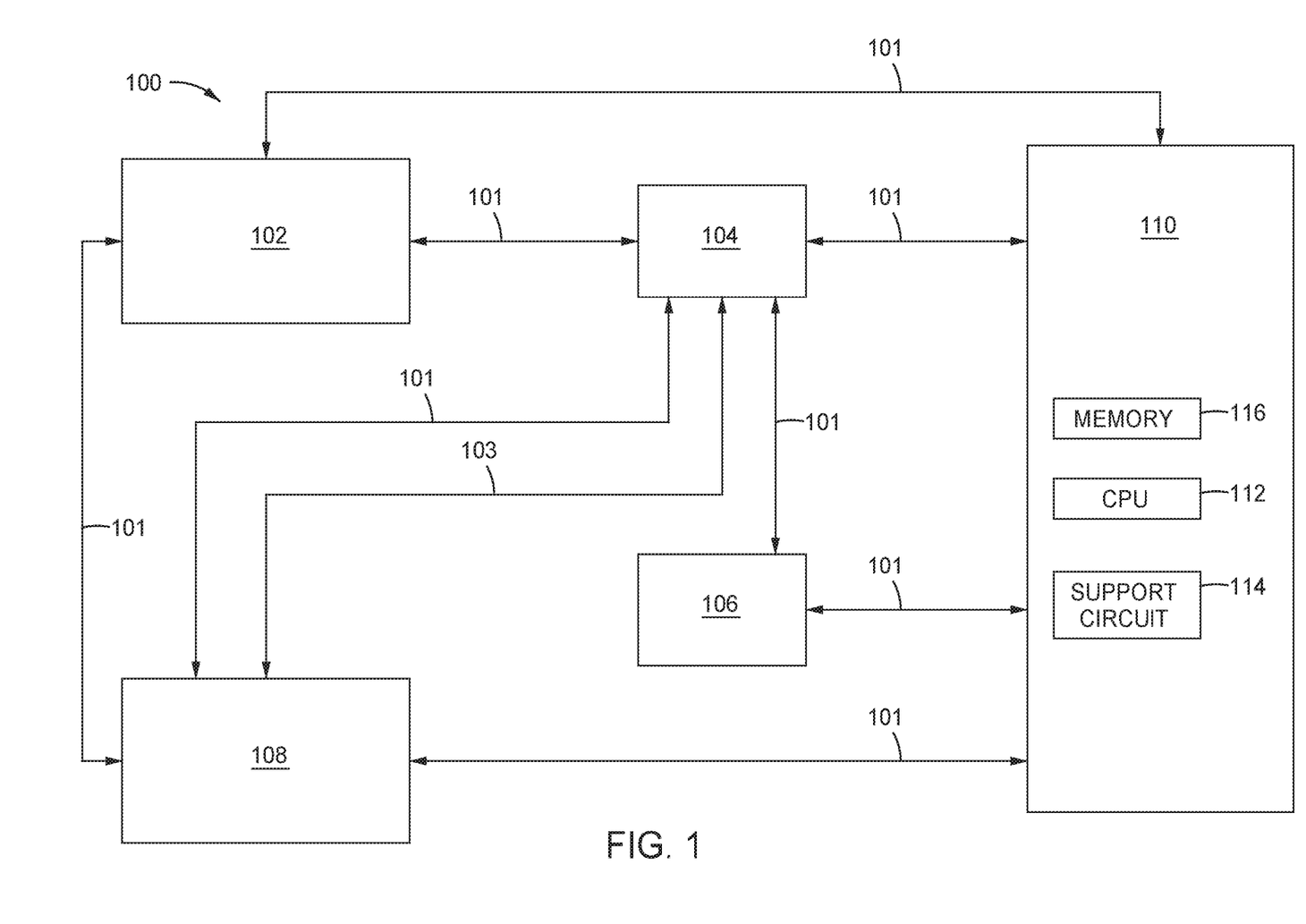
FIG. 1 is a schematic diagram of a lithography environment according to an embodiment described herein.

FIG. 1 is a schematic diagram of a lithography environment 100. As shown, the lithography environment 100 includes, but is not limited to, a virtual mask device 102, a metrology device 104, an assessment device 106, a maskless lithography device 108, a controller 110, a plurality of communication links 101, and a transfer system 103. As further described herein, the assessment device 106 is operable to perform one or more computation, simulation, or modeling processes to compile at least one of a correction model or a calibration offset data as further described herein. Additional lithography environment devices (i.e., the virtual mask device 102, the metrology device 104, the assessment device 106, and the maskless lithography device 108) may be included in the lithography environment 100. Each of lithography environment devices is operable to be connected to each other via the communication links 101. Each of lithography environment devices is operable to be connected to the controller 110 by the communication links 101. Alternatively or additionally, each of the lithography environment devices can communicate indirectly by first communicating with the controller 110, followed by the controller communicating with the lithography environment device in question. The lithography environment 100 can be located in the same area or production facility, or the each of the lithography environment devices can be located in different areas.

Figure 5:
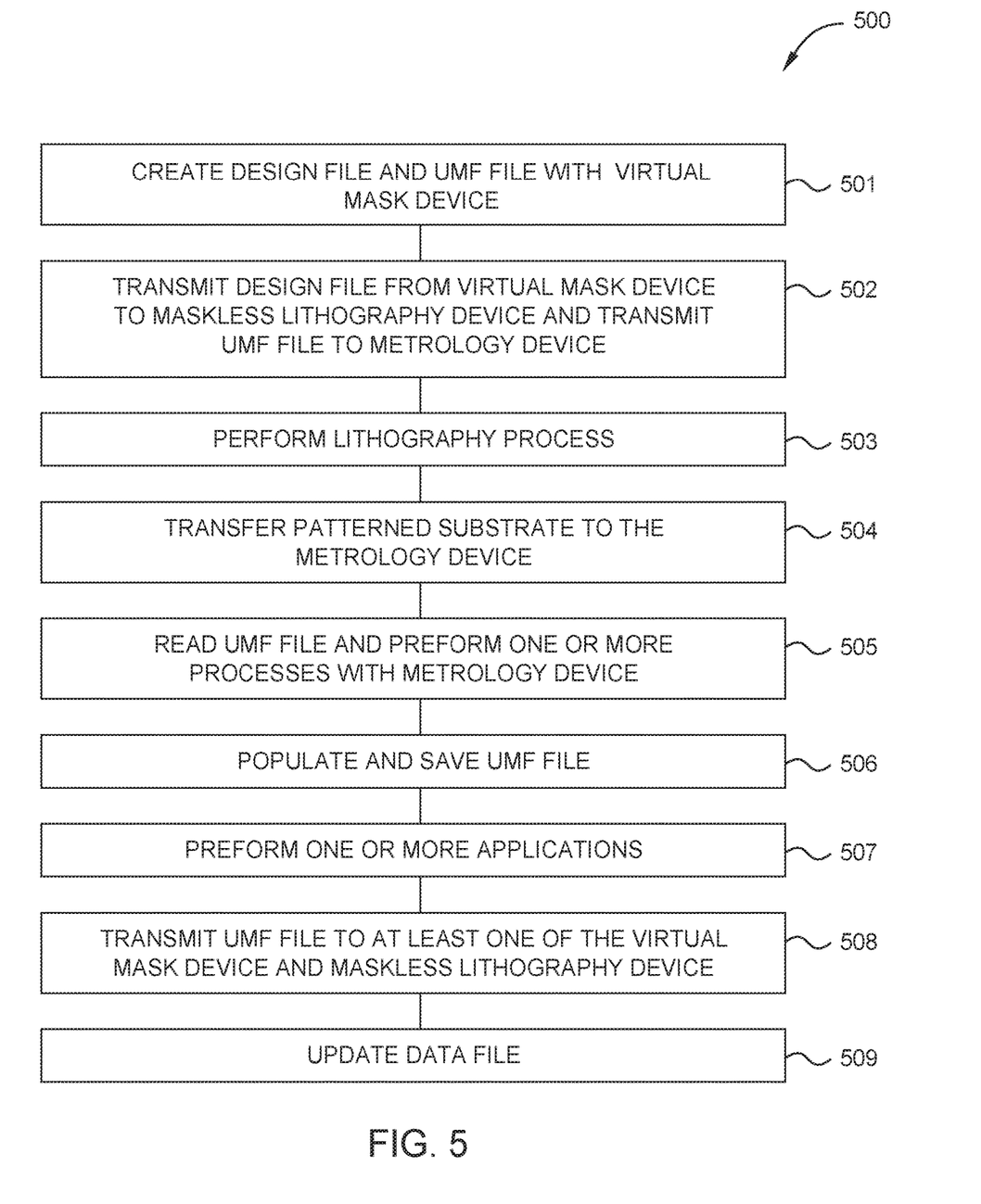
FIG. 5 is a flow diagram of a maskless lithography method according to an embodiment described herein.

Each of the plurality of lithography environment devices are additionally indexed with method 500 operations described herein. Each of the virtual mask device 102, the metrology device 104, the assessment device 106, the maskless lithography device 108, and controller 110 include an on-board processor and memory, where the memory is configured to store instructions corresponding to any portion of the method 500 described below. The communication links 101 may include at least one of wired connections, wireless connections, satellite connections, and the like. The communications links 101 include sending and receiving a universal metrology file (UMF) or any other file used to store data, according to embodiments further described herein. The communications links 101 can include temporarily or permanently storing files or data in the cloud, before transferring or copying the files or data to a lithography system tool.

The maskless lithography device 108 and the metrology device 104 are connected by the transfer system 103. The transfer system is operable to transfer a substrate between the maskless lithography device 108 and the metrology device 104. In one embodiment, which can be combined with other embodiments described herein, the transfer system 103 can include robots or other equipment connectable to the controller 110 operable to transfer patterned wafers. In one embodiment, which can be combined with other embodiments described herein, the transfer system 103 is physically operable by the user.

The controller 110 includes a central processing unit (CPU) 112, support circuits 114 and memory 116. The CPU 112 can be one of any form of computer processor that can be used in an industrial setting for controlling the lithography environment devices. The memory 116 is coupled to the CPU 112. The memory 116 can be one or more of readily available memory, such as random access memory (RAM), read only memory (ROM), floppy disk, hard disk, or any other form of digital storage, local or remote. The support circuits 114 are coupled to the CPU 112 for supporting the processor in a conventional manner. These circuits include cache, power supplies, clock circuits, input/output circuitry, subsystems, and the like. The controller 110 can include the CPU 112 that is coupled to input/output (I/O) devices found in the support circuits 114 and the memory 116.

The memory 116 can include one or more software applications, such as a controlling software program. The memory 116 can also include stored media data that is used by the CPU 112 to perform the method 500 described herein. The CPU 112 can be a hardware unit or combination of hardware units capable of executing software applications and processing data. In some configurations, the CPU 112 includes a central processing unit (CPU), a digital signal processor (DSP), an application-specific integrated circuit (ASIC), and/or a combination of such units. The CPU 112 is generally configured to execute the one or more software applications and process the stored media data, which can be each included within the memory 116. The controller 110 controls the transfer of data and files to and from the various lithography environment devices. The memory 116 is configured to store instructions corresponding to any operation of the method 500 according to embodiments described herein.

Figure 2:
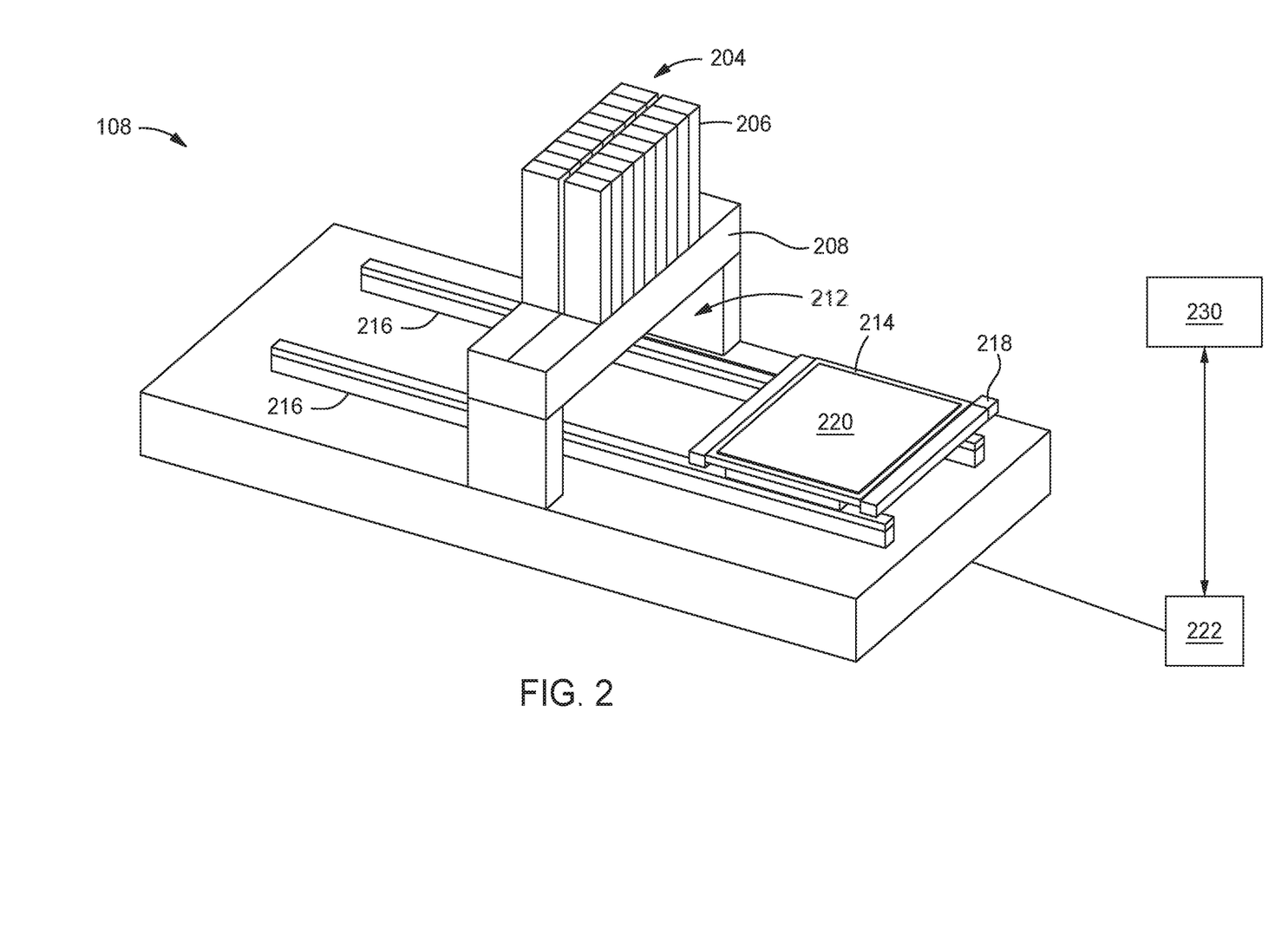
FIG. 2 is a perspective view of an exemplary maskless lithography device according to an embodiment described herein.

FIG. 2 is a perspective view of an exemplary maskless lithography device 108, such as a digital lithography system, that may benefit from embodiments described herein. The maskless lithography device 108 includes a stage 214 and a processing unit 204. The stage 214 is supported by a pair of tracks 216. A substrate 220 is supported by the stage 214. The stage 214 is operable to move along the pair of tracks 216. An encoder 218 is coupled to the stage 214 in order to provide information of the location of the stage 214 to a controller 222.

The controller 222 is generally designed to facilitate the control and automation of the processing techniques described herein. The controller 222 may be coupled to or in communication with the processing unit 204, the stage 214, and the encoder 218. The processing unit 204 and the encoder 218 may provide information to the controller 222 regarding the substrate processing and the substrate aligning. For example, the processing unit 204 may provide information to the controller 222 to alert the controller 222 that substrate processing has been completed. The controller 222 facilitates the control and automation of a maskless lithography process based on a design file provided by the interface 230. The design file (or computer instructions), which may be referred to as an imaging design file, readable by the controller 222, determines which tasks are to be performed on a substrate. The design file (e.g., the design file 420 of FIG. 4) includes a mask pattern data. The mask pattern data includes a mask pattern 302 (shown in FIG. 3) and code to monitor and control the processing time and substrate position. The mask pattern 302 corresponds to a pattern to be written into the photoresist using the electromagnetic radiation.

The substrate 220 comprises any suitable material, for example, glass, which is used as part of a flat panel display. In other embodiments, which can be combined with other embodiments described herein, the substrate 220 is made of other materials capable of being used as a part of the flat panel display. The substrate 220 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

Figure 3:
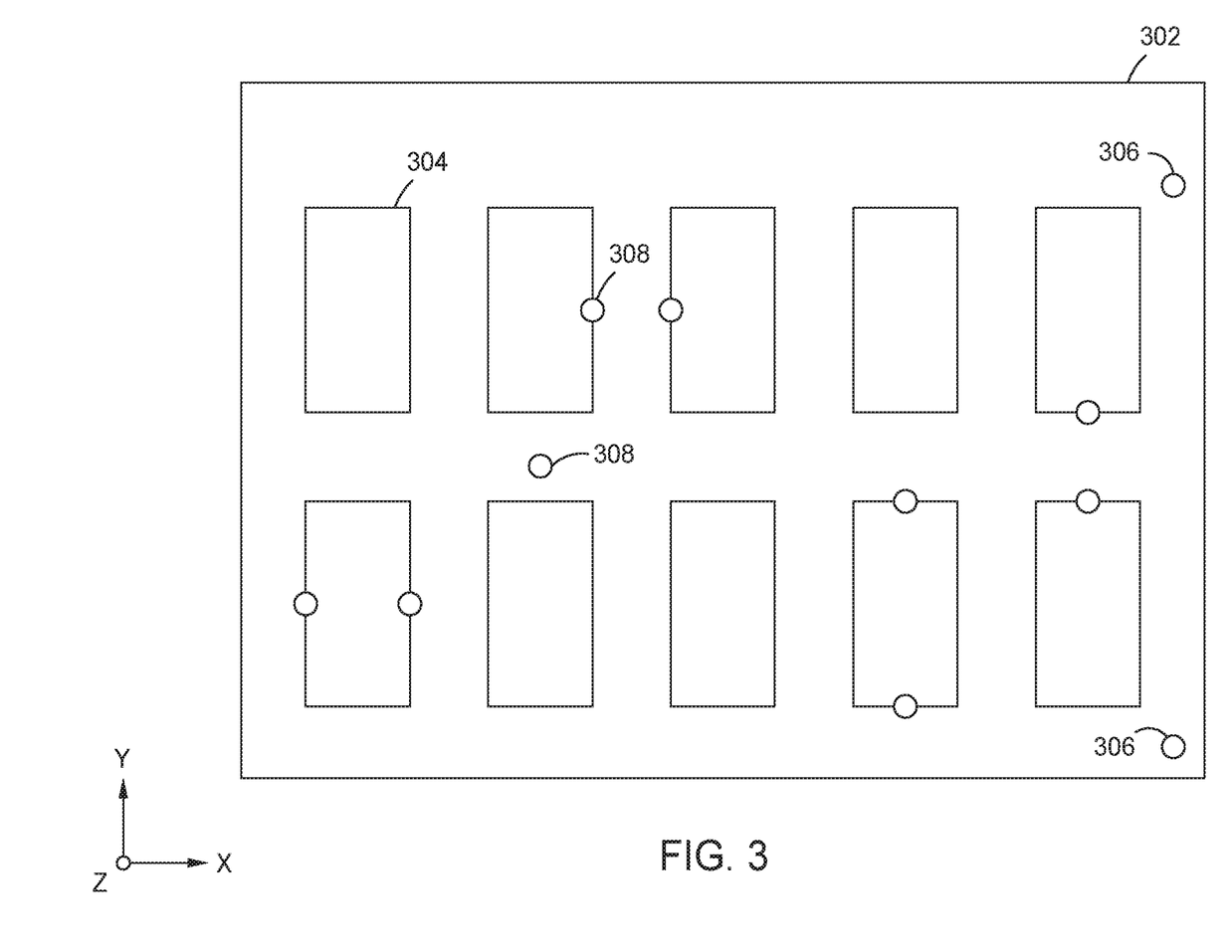
FIG. 3 is a schematic view of a mask pattern according to an embodiment described herein.

The processing unit 204 is supported by the support 208 such that the processing unit 204 straddles the pair of tracks 216. The support 208 provides an opening 212 for the pair of tracks 216 and the stage 214 to pass under the processing unit 204. The processing unit 204 is a pattern generator configured to receive the mask pattern data from the interface 230 and expose the photoresist in the maskless lithography process using one or more image projection systems 206 operable to project write beams of electromagnetic radiation to the substrate 220. The pattern generated by the processing unit 204 is projected by the image projection systems 206 to expose the photoresist of the substrate 220 to the mask pattern 302 that is written into the photoresist. In one embodiment, which can be combined with other embodiments described herein, each image projection system 206 includes a spatial light modulator to modulate the incoming light to create the desired image. Each spatial light modulator includes a plurality of electrically addressable elements that may be controlled individually. Each electrically addressable element may be in an "ON" position or an "OFF" position based on the mask pattern data and corrections provided by positional correction models created through the method 500 described herein. When the light reaches the spatial light modulator, the electrically addressable elements that are in the "ON" position project a plurality of write beams to a projection lens (not shown). The projection lens then projects the write beams to the substrate 220. The electrically addressable elements include, but are not limited to, digital micromirrors, liquid crystal displays (LCDs), liquid crystal over silicon (LCoS) devices, ferroelectric liquid crystal on silicon (FLCoS) devices, microshutters, microLEDs, VCSELs, liquid crystal displays (LCDs), or any solid state emitter of electromagnetic radiation.

FIG. 3 is a schematic view of a mask pattern 302 to be written into the photoresist using the processing unit 204. The mask pattern data includes the mask pattern 302. The mask pattern 302 includes one or more polygons 304 corresponding to portions of the photoresist to be exposed to electromagnetic radiation projected by the processing unit 204. It is to be understood that any shaped polygons could be used one or more polygons 304, such that exposed portions form one or more different features in the photoresist. Each of the one or more features of the exposed photoresist includes one or more target values, such as a critical dimension. The mask pattern data of the design file 420 also includes one or more metrology alignment marks 306 to be exposed. Each of the metrology alignment marks 306 includes an x-coordinate and y-coordinate such that the metrology device 104 can align to perform recipe-based measurements at defined locations, such as one or more metrology sites 308. The mask pattern data of the design file 420 includes the one or more metrology sites 308 to be measured by the metrology device 104 after the substrate 220 is processed via the maskless lithography device 108. Each of the metrology sites 308 includes an x-coordinate and y-coordinate. After the substrate 220 is processed via the maskless lithography device 108 the patterned substrate 220 may undergo further processing, such as development of the photoresist.

Figure 4:
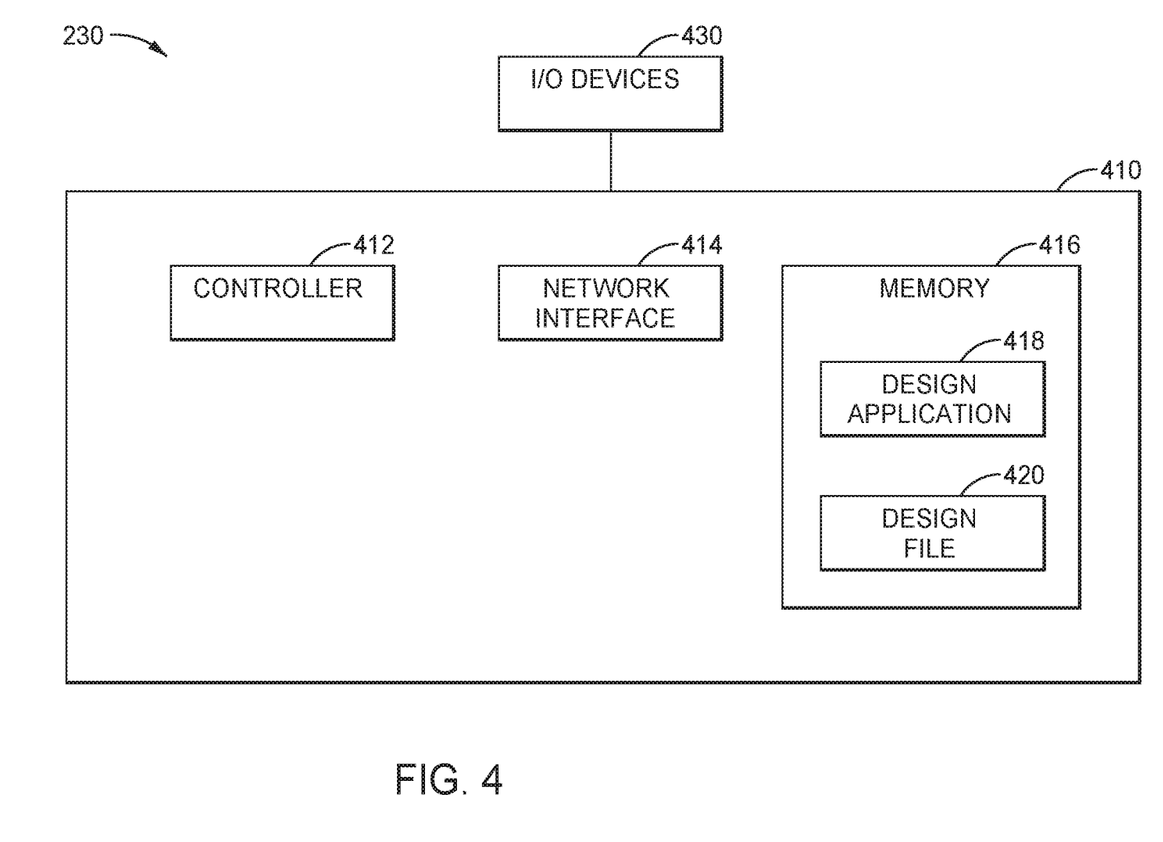
FIG. 4 is a schematic view of an interface according to an embodiment described herein.

FIG. 4 is a schematic view of the interface 230. The interface 230 includes a computing device 410 and input/output (I/O) devices 430. The interface 230 may be utilized to at least one of optimize, verify, and update a design file (e.g., the design file 420). The interface 230 may be utilized to at least one of optimize, verify, and update the design file 420 per instructions and readable data of a Universal Metrology File (UMF) provide from one of the virtual mask device 102, the metrology device 104, and the assessment device 106, and the controller 110. The optimization, verification, and updating of the design file 420 per the UMF file is further described in operations of the method 500.

The computing device 410 may include a controller 412, a network interface 414, and memory 416. The controller 412 retrieves and executes programing data stored in the memory 416 and coordinates operations of other system components. Similarly, the controller 412 stores and retrieves application data residing in the memory 416. The controller 412 may be one or more central processing units (CPUs).

The memory 416 may store instructions and logic to be executed by the controller 412. Further, the memory 416 may be one or more of a random access memory (RAM) and a non-volatile memory (NVM). The NVM may be a hard disk, a network attached storage (NAS), and a removable storage device, among others. Further, the memory 416 may include a design application 418 and a design file 420.

The design application 418 at least one of optimizes, verifies, and updates the design data of the design file 420. The design application 418 may be controlled by the controller 412 to optimize, and/or update the design data of the design file 420.

The design file 420 may be stored within the memory 416 and is accessible by the controller 412 and the design application 418. The design file 420 includes the mask pattern data that is interpreted by the controller 222 to pattern the photoresist disposed on the substrate 220. The design file 420 may be provided in different formats. For example, the format of the design file 420 may be one of a GDS format, and an OASIS format, among others. The mask pattern data of the design file 420 includes the mask pattern 302, the metrology alignment marks 306, and the metrology sites 308. Other data included in the design file includes exposure dosage data, exposure focus data, and image projection system (IPS) to IPS calibration data. The exposure dosage data corresponds to the dosage of the write beams to be projected to the photoresist. The exposure focus data corresponds to the focus of the each of the image projection systems 206. The IPS to IPS calibration data corresponds to the stitching of the image projection systems 206 such the entirety of the mask pattern 302 is projected. The design file 420 may be in the form of a Bitmap or similar file.

The I/O devices 430 may include one or more of a keyboard, display device, mouse, audio device, and a touch screen, among others. The I/O devices 430 may be utilized to enter information into the interface 230 and/or output data from the interface 230. For example, a user may use a keyboard and a pointing device to generate and/or adjust elements of the design file 420. In another embodiment, which can be combined with other embodiments described herein, the I/O devices 430, via the network interface 414 in communication with the communication links 101, are coupled to the controller 110. The interface 230 being coupled to the controller provides for a computer-integrated manufacturing (CIM) procedure utilizing computers to control the entirety of the operations of the method 500 described herein.

FIG. 5 is a flow diagram of method 500 of a maskless lithography. At operation 501, the design file 420 is created by the virtual mask device 102. The design file 420 includes at least the mask pattern data, the mask pattern 302, the one or more metrology alignment marks 306, the one or more metrology sites 308, the exposure dosage data, the exposure focus data, and the image projection system (IPS) to IPS calibration data. The UMF file includes a one or more of sections of elements. Each element readable and fillable by at least the virtual mask device 102, the metrology device 104, the assessment device 106, the maskless lithography device 108, and the controller 110. A format of the UMF file includes a text-based markup language that is user and machine readable and is operable to retain and store the sections of elements.

The sections of the UMF file include, but are not limited to, an identification section, a metrology instruction section, an application instruction section, an alignment mark section, an image saving section, and a metrology measurement section. The elements of each section are identifiable by the lithography environment devices and the controller 110. The elements of the identification section include, but are not limited to, a substrate identifier corresponding to the substrate 220 to be processed, a CIM identifier corresponding to the CIM procedure, and a layer identifier corresponding to the layer of the photoresist to be developed.

The metrology instruction section defines which metrology process will be utilized by the metrology device 104 to determine a specified metric (e.g., one or more target values, such as a critical dimension, of the one or more features of the exposed photoresist). The elements of the metrology section include, but are not limited to, a box in box metrology process, a critical dimension (CD) metrology process, a resist side-wall angle metrology process, an edge-to-edge metrology process, a scalloping metrology process, a via metrology process, and an image metrology process.

The box in box metrology process determines positional errors of features of the exposed photoresist. The CD metrology process determines sizes of feature lines or spaces of the exposed photoresist. The resist side-wall angle metrology process determines side-wall angles of the photoresist after development. The edge-to-edge metrology process determines the distance between two edges of neighboring patterns of the exposed photoresist. The scalloping metrology process determines pattern edge variations. The via metrology process that determines dimensions of a via pattern defined by either horizontal or vertical critical dimensions of features, or by radius and ellipticity of the features. The image metrology process determines multiple image metrics such as image gray level, image contrast, and the like. Each of the elements has a metrology recipe corresponding to the metrology process to be performed by the metrology device 104.

The application instruction section defines which application will be utilized by one of the metrology device 104 and the assessment device 106. The elements of the application instruction section include, but are not limited to, a total pitch application, an overlay application, maskless lithography device matching application, an IPS rotation application, an pixel pitch application, a multiplicity application, a dose calculation application, a focus calculation application, a top and bottom CD application, a CD uniformity application, a tolerance application, and a mura analysis application.

The total pitch application adjusts an overall scaling and orthogonality error of the substrate 220. The overlay application adjusts a printing difference between two layers of the photoresist via one or more computation, simulation, or modeling processes performed by the assessment device 106. The maskless lithography device matching application compensates for printing signature differences between multiple maskless lithography devices 108. The IPS rotation application determines the rotation of the IPS with respect to scan direction. The pixel pitch application determines the pitch between electrically addressable elements (i.e., pixel pitch) as observed on the substrate 220. The multiplicity application determines an optimum pixel-blending multiplicity based on printed image properties. The dose calculation application determines an optimum nominal dose based on the exposure of photoresists under multiple dose conditions. The focus calculation application determines an optimum nominal focus based on exposure of photoresists under several focus conditions. The top and bottom CD application optimizes lithography process parameters and the mask pattern data based on top CD and bottom CD measurements of features of the exposed photoresist. A CD uniformity application optimizes lithography process parameters and the mask pattern data to improve CD uniformity of features of the exposed photoresist. The tolerance application determines a nominal dose and focus value to optimize the tolerance based on any metrology metric, such as CD, based on exposure of photoresists at several dose and focus conditions. The mura analysis application utilizes one or multiple metrology metrics to determine mura and optimize lithography process parameters or the mask pattern data to minimize mura. Mura (i.e., clouding), is used to describe uneven exposure of the substrate 220.

Each of the applications compiles at least one of a correction model and a calibration offset data to the elements of the application instruction section based on the metrology data saved in the UMF file. In one embodiment, which can be combined with other embodiments described herein, the correction model or the calibration offset data embedded to the UMF file is saved to a correction model file. In addition to the UMF file, the correction model file that is readable by the interface 230 to at least one of optimize, verify, and update the design file 420 and update lithography process parameters for subsequent layers of the photoresist of the substrate 220 or subsequent substrates.

The alignment mark section includes two or more metrology alignment marks 306 each having an x-coordinate and y-coordinate such that the metrology device 104 can align to perform recipe-based measurements at defined locations, such as one or more metrology sites 308. The image saving section instruction section includes image saving instructions to be performed by the metrology device 104. The image saving section instruction section includes, but is not limited to, an image format element, an image size element, and a pixel size element. The metrology measurement section includes one or more metrology sites 308 having an x-coordinate and y-coordinate such that the metrology device 104 may perform at least one metrology process at the metrology sites 308 per the metrology instruction section and the application instruction section. The metrology measurement section includes elements that are fillable per the metrology instruction section and the application instruction section. The fillable elements are readable by at least the virtual mask device 102, the metrology device 104, the assessment device 106, the maskless lithography device 108, and the controller 110.

At operation 502, the design file 420 is transmitted from the virtual mask device 102 to the maskless lithography device 108 and the UMF file is transmitted to the metrology device 104. At operation 503, a lithography process is performed to expose the substrate 220 to the mask pattern of the mask pattern data included in the design file 420. Optionally, after the lithography process of operation 503, the substrate 220 may be further processed, for example by development of the photoresist and/or etching, to form a pattern on the substrate 220. At operation 504, the patterned substrate 220 is transferred to the metrology device 104. At operation 505, the metrology device 104 reads the UMF file and preforms one or more processes according to the metrology instruction section and image saving section. The one or more processes are performed according to the metrology instruction section and image saving section corresponding to the identification section of the UMF file. At operation 506, the image saving section and a metrology measurement section are populated and saved to the UMF file based on the metrology measurements.

At operation 507, one or more applications are performed to compile at least one of a correction model and a calibration offset data in the UMF file. The one or more applications are performed according to the application instruction section of the UMF file. In one embodiment, which can be combined with other embodiments described herein, the each of the one or more applications are performed by the metrology device 104. In another embodiment, which can be combined with other embodiments described herein, the UMF file is transmitted to the assessment device 106 and each of the one or more applications are performed by the metrology device 104. In yet another embodiment, according to the application instruction section of the UMF file a first portion of one or more applications are performed by the metrology device 104, the UMF file is transmitted to the assessment device 106, and a portion of second of one or more applications are performed by the assessment device 106 to compile at least one of a correction model and the calibration offset data in the UMF file. The assessment device 106 is operable to store updated lithography process values, such as updated exposure dosage data, updated exposure focus data, and updated IPS to IPS calibration data, to the UMF file such that interface 230 is operable to adjust lithography process parameters for subsequent layers of the photoresist of the substrate 220 or subsequent substrates.

At operation 508, the UMF file is transmitted from at least one of the metrology device 104 and the assessment device 106 to at least one of the virtual mask device 102 and the maskless lithography device 108. At operation 509, the design file 420 is updated by at least one the virtual mask device 102 and the maskless lithography device 108 according one of the correction model and the calibration offset data saved to the UMF file or the correction model file.

The calibration offset data includes the parameters of the maskless lithography device 108 to be updated. These parameters include, but not are limited to, dose, focus, multiplicity, numerical aperture (NA), illumination coherency, and illumination shape for each IPS. The correction model can contain parameters corresponding to positional corrections at each (x,y) position on the substrate 220 as well as focus and dose correction as function of (x,y) position on the substrate 220. The parameters of the correction model may include global or local corrections.

Global corrections include, but are not limited to, a global scaling, shift, and rotation corrections as function of (x,y) position. Global corrections may also include focus and dose adjustments for each IPS. The local corrections may include local offsets which can be either stored as a correction vector per (x,y) grid point or as polynomial functions. Local corrections can be applied to each spatial light modulator where electrically addressable elements may be in an "ON" position or an "OFF" position based on the mask pattern data and parameters provided by the correction model. Electrically addressable elements "ON" and "OFF" conditions may also be adjusted during exposure to create local dose adjustments. Local dose variations may be achieved by dynamically adjusting the amount of energy landing on a specific location on the substrate 220. In one embodiment which can be combined with other embodiments described herein, global corrections are applied to the mask pattern 302 before the mask pattern data is transmitted to each spatial light modulator. In another embodiment which can be combined with other embodiments described herein, one or more global or local CD corrections are applied to the mask pattern 302 before the mask pattern data is passed to each spatial light modulator. The correction values are identified by the interface 230 via the metrology measurements stored in the UMF file and the correction models and calibration offset data stored in the UMF file. The correction models and calibration offset data created per the elements of applications of the application instruction section utilizing the meteorology measurements stored in the UMF file.

In summation, a system, a software application, and a method of a lithography process to update one or more of a mask pattern, maskless lithography device parameters, and lithography process parameters utilizing a file readable by each of the components of a lithography environment are provided. The system, the software application, and method utilize a UMF file described herein. The UMF file has a format having a text-based markup language that is readable and operable to be transmitted between a virtual mask device, a metrology device, a maskless lithography device, assessment device, and a controller of a lithography environment described herein. A plurality of sections of the UMF file has elements operable to be retained and stored in the non-transitory computer-readable medium by each of the virtual mask device, the metrology device, the maskless lithography device, the assessment device, and the controller. The file readable by each of the components of a lithography environment stores and shares textual data and facilitates communication between of the components of a lithography environment such that the mask pattern corresponds to a pattern to be written is updated, the maskless lithography device of the lithography environment is calibrated, and process parameters of the lithography process are corrected for accurate writing of the mask pattern on successive substrates.

What is claimed is:

1. A method, comprising:
   creating a design file and a universal metrology file (UMF) file with a virtual mask device of a lithography environment, wherein:
      the lithography environment comprises a controller operable to be connected to the virtual mask device, a metrology device, and a maskless lithography device; and
      the UMF file is readable by each of the controller, the virtual mask device, the metrology device, and the maskless lithography device;
   transmitting the design file to the maskless lithography device and transmitting the UMF file to the metrology device;
   performing a lithography process comprising patterning a first substrate based on the design file with the maskless lithography device and transferring the first substrate patterned by the maskless lithography device to the metrology device;
   performing one or more metrology processes with the metrology device according to instructions of the UMF file and populating the UMF file with metrology measurements;
   performing a first portion of one or more applications with the metrology device according to instructions of the UMF file and compiling at least one of a correction model and a calibration offset data in the UMF file;
   transmitting the UMF file to at least one of the virtual mask device and the maskless lithography device; and
   updating the design file with at least one of the virtual mask device and the maskless lithography device.

2. The method of claim 1, wherein a format of the UMF file includes a text-based markup language that is user and machine readable and is operable to retain and store sections of elements.

3. The method of claim 2, wherein the sections of the UMF file include an identification section, a metrology instruction section, an application instruction section, an alignment mark section, an image saving section, and a metrology measurement section.

4. The method of claim 1, wherein the lithography environment comprises an assessment device connected to the controller and wherein:
   the assessment device performs a second portion of the one or more applications according to instructions of the UMF file; and
   the assessment device compiles at least one of the correction model and the calibration offset data in the UMF file or a correction model file.

5. The method of claim 4, wherein the assessment device is operable to perform one or more computation, simulation, or modeling processes to compile at least one of the correction model or the calibration offset data.

6. The method of claim 1, further comprising updating lithography process parameters and maskless lithography device parameters according to at least one of the correction model and the calibration offset data.

7. The method of claim 1, further comprising transmitting an updated design file to the maskless lithography device and patterning a second substrate with the maskless lithography device.

8. A non-transitory computer-readable medium storing instructions that, when executed by a processor, cause a computer system to perform the method of:
   creating a design file and a universal metrology file (UMF) file with a virtual mask device of a lithography environment, wherein:
      the lithography environment comprises a controller operable to be connected to the virtual mask device, a metrology device, and a maskless lithography device; and
      the UMF file is readable by each of the controller, the virtual mask device, the metrology device, and the maskless lithography device;
   transmitting the design file to the maskless lithography device and transmitting the UMF file to the metrology device;
   performing a lithography process comprising patterning a first substrate with the maskless lithography device and transferring the first substrate patterned by the maskless lithography device to the metrology device;
   performing one or more metrology processes with the metrology device according to instructions of the UMF file and populating the UMF file with metrology measurements;
   performing a first portion of one or more applications with the metrology device according to instructions of the UMF file and compiling at least one of a correction model and a calibration offset data in the UMF file;
   transmitting the UMF file to at least one of the virtual mask device and the maskless lithography device; and
   updating at least one of the design file, lithography process parameters, and maskless lithography device parameters according to at least one of the correction model and the calibration offset data with at least one of the virtual mask device and the maskless lithography device.

9. The non-transitory computer-readable medium of claim 8, wherein a format of the UMF file includes a text-based markup language that is user and machine readable and is operable to retain and store sections of elements.

10. The non-transitory computer-readable medium of claim 8, wherein the lithography environment comprises an assessment device connected to the controller and wherein:
    the assessment device performs a second portion of the one or more applications according to instructions of the UMF file; and
    the assessment device compiles at least one of the correction model and the calibration offset data in the UMF file or a correction model file.

11. A non-transitory computer-readable medium storing instructions that, when executed by a processor, cause a computer system to perform the method of:
- creating a design file and a universal metrology file (UMF) file with a virtual mask device of a lithography environment, wherein the UMF file includes:
  - a format having a text-based markup language that is readable and operable to be transmitted between a virtual mask device, a metrology device, a maskless lithography device, and a controller of a lithography environment; and
  - a plurality of sections having elements operable to be retained and stored in the non-transitory computer-readable medium by each of the virtual mask device, the metrology device, the maskless lithography device, and the controller, the plurality of sections including:
  - an identification section;
  - a metrology instruction section;
  - an application instruction section;
  - an alignment mark section;
  - an image saving section; and
  - a metrology measurement section;
- transmitting the design file to the maskless lithography device and transmitting the UMF file to the metrology device;
- performing one or more metrology processes with the metrology device according to instructions of the UMF file and populating the UMF file with metrology measurements; and
- transmitting the UMF file and updating the design file with at least one of the virtual mask device or the maskless lithography device.

12. The non-transitory computer-readable medium of claim 11, wherein the elements of the identification section include at least one of a substrate identifier corresponding to a substrate to be processed, a computer-integrated manufacturing (CIM) identifier corresponding to a CIM procedure, and a layer identifier corresponding to a layer of a photoresist disposed on the substrate to be developed.

13. The non-transitory computer-readable medium of claim 11, wherein the elements of the metrology instruction section include at least one of a critical dimension (CD) metrology process, a resist side-wall angle metrology process, an edge-to-edge metrology process, a scalloping metrology process, a via metrology process, and an image metrology process.

14. The non-transitory computer-readable medium of claim 11, wherein the elements of the application instruction section include at least one of a total pitch application, an overlay application, maskless lithography device matching application, an IPS rotation application, an pixel pitch application, a multiplicity application, a dose calculation application, a focus calculation application, a top and bottom CD application, a CD uniformity application, a tolerance application, and a mura analysis application.

15. The non-transitory computer-readable medium of claim 11, wherein the elements of the identification section include at least one of an image format element, an image size element, and a pixel size element.

* * * * *